United States Patent
Shimogawa et al.

(10) Patent No.: US 7,940,577 B2
(45) Date of Patent: May 10, 2011

(54) SEMICONDUCTOR INTEGRATED CIRCUIT DEVICE MINIMIZING LEAKAGE CURRENT

(75) Inventors: Kenjyu Shimogawa, Kanagawa (JP); Hiroshi Furuta, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 1159 days.

(21) Appl. No.: 11/592,978

(22) Filed: Nov. 6, 2006

(65) Prior Publication Data
US 2007/0109700 A1  May 17, 2007

(30) Foreign Application Priority Data

Nov. 15, 2005 (JP) ................................ 2005-329692
Sep. 26, 2006 (JP) ................................ 2006-260834

(51) Int. Cl.
*G11C 7/00* (2006.01)
(52) U.S. Cl. ............... 365/189.09; 365/149; 365/189.07; 365/189.11; 365/210.1; 365/211; 365/222; 327/534
(58) Field of Classification Search .................. 365/149, 365/189.07, 189.09, 189.11, 210.1, 222; 327/534
See application file for complete search history.

(56) References Cited

U.S. PATENT DOCUMENTS

| 6,665,225 | B2 | 12/2003 | Tsujino |
| 6,826,074 | B2* | 11/2004 | Yamauchi ................... 365/154 |
| 7,266,031 | B2* | 9/2007 | Kim et al. ................... 365/211 |
| 2002/0041531 | A1* | 4/2002 | Tanaka et al. ............... 365/205 |
| 2003/0197546 | A1* | 10/2003 | Sim et al. ................... 327/534 |
| 2005/0104566 | A1* | 5/2005 | Kim .......................... 323/226 |
| 2005/0105367 | A1 | 5/2005 | Kim et al. |

FOREIGN PATENT DOCUMENTS

| JP | 8-106790 A | 4/1996 |
| JP | 2000-011651 | 1/2000 |
| JP | 2003-173675 | 6/2003 |

OTHER PUBLICATIONS

M. Chang et al., "Impact of Gate-Induced Drain Leakage on Retention Time Distribution of 256 Mbit DRAM With Negative Wordline Bias," IEEE Transactions on Electrion Devices, vol. 50:4, Apr. 2003, pp. 1036-1041.
K. Osada et al., "16.7-fA/Cell Tunnel-Leakage-Suppressed 16-Mb SRAM for Handling Cosmic-Ray-Induced Multierrors," IEEE Journal of solid-State Circuits, vol. 3:11, Nov. 2003, pp. 1952-1957.
M. Yamaoka et al., "A 300MHz 25μA/Mb leakage On-Chip SRAM Module Featuring Process-Variation Immunity and Low-Leakage-Active Mode for Mobile-Phone Application Processor," 2004 IEEE International Solid-State Circuits Conference, pp. 1-3.

* cited by examiner

*Primary Examiner* — Hoai V Ho
(74) *Attorney, Agent, or Firm* — Foley & Lardner LLP

(57) ABSTRACT

The semiconductor integrated circuit device includes a voltage control circuit that generates a control voltage for deactivating a field effect transistor by a gate voltage. The voltage control circuit controls a voltage so as to substantially minimize the leakage current which flows when the field effect transistor is inactive with respect to a device temperature.

15 Claims, 13 Drawing Sheets

SEMICONDUCTOR INTEGRATED CIRCUIT DEVICE MINIMIZING LEAKAGE CURRENT

BACKGROUND OF THE INVENTION

1. Field of the Invention

The present invention relates to a semiconductor integrated circuit device and, particularly, to a semiconductor integrated circuit device which reduces leakage current by controlling a gate voltage in view of the temperature characteristics of the leakage current flowing when a field effect transistor is inactive.

2. Description of Related Art

In recent semiconductor integrated circuit devices, power consumption decreases along with decreasing power supply voltage while it increases at the same time along with increasing degree of integration and increasing access speed with the advent of the smaller geometry semiconductor process technology. Further, in recent semiconductor integrated circuit device, not only the power consumption during the active state but also the power consumption during the standby state pose a problem. An increase in the power consumption during the standby state is incurred by the smaller geometry semiconductor process technology and the lower power supply voltage particularly in a MISFET (Metal Insulator Semiconductor Field Effect Transistor). If the power supply voltage becomes lower, a threshold voltage of a field effect transistor should be lowered accordingly. The low threshold voltage causes an increase in subthreshold leakage current. Further, the smaller geometry semiconductor process technology causes a gate insulating layer to be thinner, which leads to an increase in leakage current.

The leakage current involves subthreshold current due to drift or diffusion of charges (subthreshold leakage current), junction leakage current between the drain region and the substrate region of MISFET (drain diffusion layer junction leakage), band to band tunnel leakage current between the drain region and the substrate region due to gate-drain electric field (GIDL: Gate Induced Drain Leakage), and tunnel leakage current between the gate and the drain, source and substrate regions. Among such leakage current, the subthreshold leakage current and the drain diffusion layer junction leakage current exhibit high temperature dependence. On the other hand, the GIDL and the tunnel leakage current between the gate and the drain, source and substrate regions exhibit low temperature dependence. In relation to such leakage current, "16.7-fA/Cell Tunnel-Leakage-Suppressed 16-Mb SRAM for Handling Cosmic-Ray-Induced Multierrors", Kenichi Osada et al., IEEE journal of solid-state circuits, Vol. 38, No. 11, pp 1952-1957, NOVEMBER 2003 provides the description regarding the leakage current component and the relationship between the leakage current and the temperature by taking the leakage current during the standby state of a SRAM (Static Random Access Memory) cell as an example. Further, "Impact of Gate-Induced Drain Leakage on Retention Time Distribution of 256 Mbit DRAM With Negative Wordline Bias", Michen Chang et al., IEEE Transactions On Electron Devices, Vol. 50, No. 4, pp 1036-1041, April 2003 provides, in FIG. 3, the description regarding the relationship between the number of fail bits and the word potential in a DRAM (Dynamic Random Access Memory) in reference to the gate voltage dependence of GIDL.

The leakage current which flows through a MISFET is described hereinafter with reference to FIG. 19. FIG. 19 shows the relationship between drain current and a gate voltage in a MISFET. In the graph of FIG. 19, the vertical axis indicates drain current in logarithmic scale, and the horizontal axis indicates a gate voltage in linear scale. As shown in FIG. 19, a certain amount of drain current flows through a MISFET in accordance with the voltage value of the gate voltage Vg when the gate voltage Vg exceeds a threshold.

The current which flows when the gate voltage Vg is below the threshold is called leakage current. When the gate voltage Vg is close to the threshold, the leakage current due to the drift of carriers is dominant. As the gate voltage Vg becomes lower, the leakage current due to the drift of carriers decreases and the leakage current due to the diffusion of carriers becomes dominant. The gate voltage at which the drain current is lowest is Vg(Id_min<ambient temperature>). At the gate voltage Vg(Id_min<ambient temperature>), drain diffusion layer junction leakage current flows. When the gate voltage falls below Vg(Id_min<ambient temperature>), GIDL increases.

The GIDL is described in further detail hereinafter. Due to the electric field between the drain region and the gate electrode, the electric field in the depletion layer in the vicinity of the surface between the drain region and the substrate region becomes stronger, and thereby the depletion layer which is created between the drain region and the substrate region is narrowed. This causes tunnel current, which is GIDL, to flow from the drain region to the substrate region. Accordingly, the GIDL becomes higher as a difference between the drain voltage and the gate voltage becomes larger.

The relationship between the drain current and the gate voltage of a MISFET is as indicated by the full line in FIG. 19 under ambient temperature, and as indicated by the dotted line under high temperature (e.g. 100° C.). Specifically, as the temperature of the substrate becomes higher, the subthreshold leakage current and the drain diffusion layer junction leakage increase, and thereby the minimum value of the leakage current increases. The voltage Vg(Id_min<high temperature>) at which the leakage current is minimal is lower than the voltage Vg(Id_min<ambient temperature>) under ambient temperature.

The increase in the leakage current raises the drawbacks such as an increase in the power consumption during standby of the semiconductor integrated circuit device and reduction of a data maintain period of a memory cell using a MISFET (e.g. DRAM cell).

An approach to reduce the subthreshold leakage current among the above leakage current is using an element such as a MTCMOS (Multi Threshold Complementary Metal Oxide Semiconductor) or a VTCMOS (Variable Threshold Complementary Metal Oxide Semiconductor).

Further, a technique of reducing the power consumption of an overall SRAM by controlling the source voltage of an NMOSFET in a SRAM cell is disclosed in "A 300 MHz 25 μA/Mb Leakage On-Chip SRAM Module Featuring Process-Variation Immunity and Low-Leakage-Active Mode for Mobile-Phone Application Processor", Masanao Yamaoka et al., IEEE International Solid-State Circuits Conference, pp 494-495, 452, 2004. A technique of reducing the standby current in a DRAM by setting the gate voltage of an NMISFET in a memory cell to a negative voltage is disclosed in Japanese Unexamined Patent Application Publication No. 2000-11651. Further, a technique of reducing GIDL by setting the voltage applied to a word line during standby of a DRAM to be slightly higher than a ground voltage is disclosed in Japanese Unexamined Patent Application Publication No. 2003-173675.

Although the above techniques provide control of a gate voltage or a source voltage so as to reduce leakage current, they do not provide control in accordance with temperature.

The gate voltage Vg(Id_min) at which the leakage current is minimal is temperature dependent. Therefore, although the above techniques can reduce leakage current when the semiconductor integrated circuit device is at an ambient temperature, for example, the leakage current undesirably increases when the temperature becomes higher.

Further, according to the technique disclosed in Japanese Unexamined Patent Application Publication No. 2000-11651 which sets the gate voltage to a negative voltage, the negative voltage can cause the drain current to increase to be non-minimal. Further, if an absolute value of the negative voltage of the gate voltage is large, much time and energy are required to increase the gate voltage to a power supply voltage. This hinders high-speed access to a memory cell, for example.

SUMMARY OF THE INVENTION

According to an aspect of the present invention, there is provided a semiconductor integrated circuit device including a field effect transistor, and a voltage control circuit generating a control voltage to be supplied to a gate terminal of the field effect transistor for deactivating the field effect transistor. The voltage control circuit controlling a voltage so as to substantially minimize leakage current which flows when the field effect transistor is inactive in accordance with a device temperature.

In this semiconductor integrated circuit device, a control voltage is controlled in accordance with a device temperature so that the leakage current which flows when a field effect transistor is inactive is substantially minimal. This enables the leakage current to be substantially minimized regardless of a device temperature. As a result, power consumption during standby can be substantially minimized irrespective of a temperature in the semiconductor integrated circuit device.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Exemplary embodiments of the present invention are described hereinafter with reference to the drawings. A semiconductor integrated circuit device of the present invention controls a gate voltage in accordance with a temperature so as to substantially minimize the leakage current of a field effect transistor (e.g. MISFET) which is formed on a semiconductor substrate (referred to hereinafter simply as the substrate). In the exemplary embodiments described below, a DRAM is used as an example of a semiconductor integrated circuit device, and the control of a gate voltage of a transfer transistor of the DRAM is described in detail by way of illustration. The leakage current in the following description refers to the leakage current as described earlier.

Figure 1:
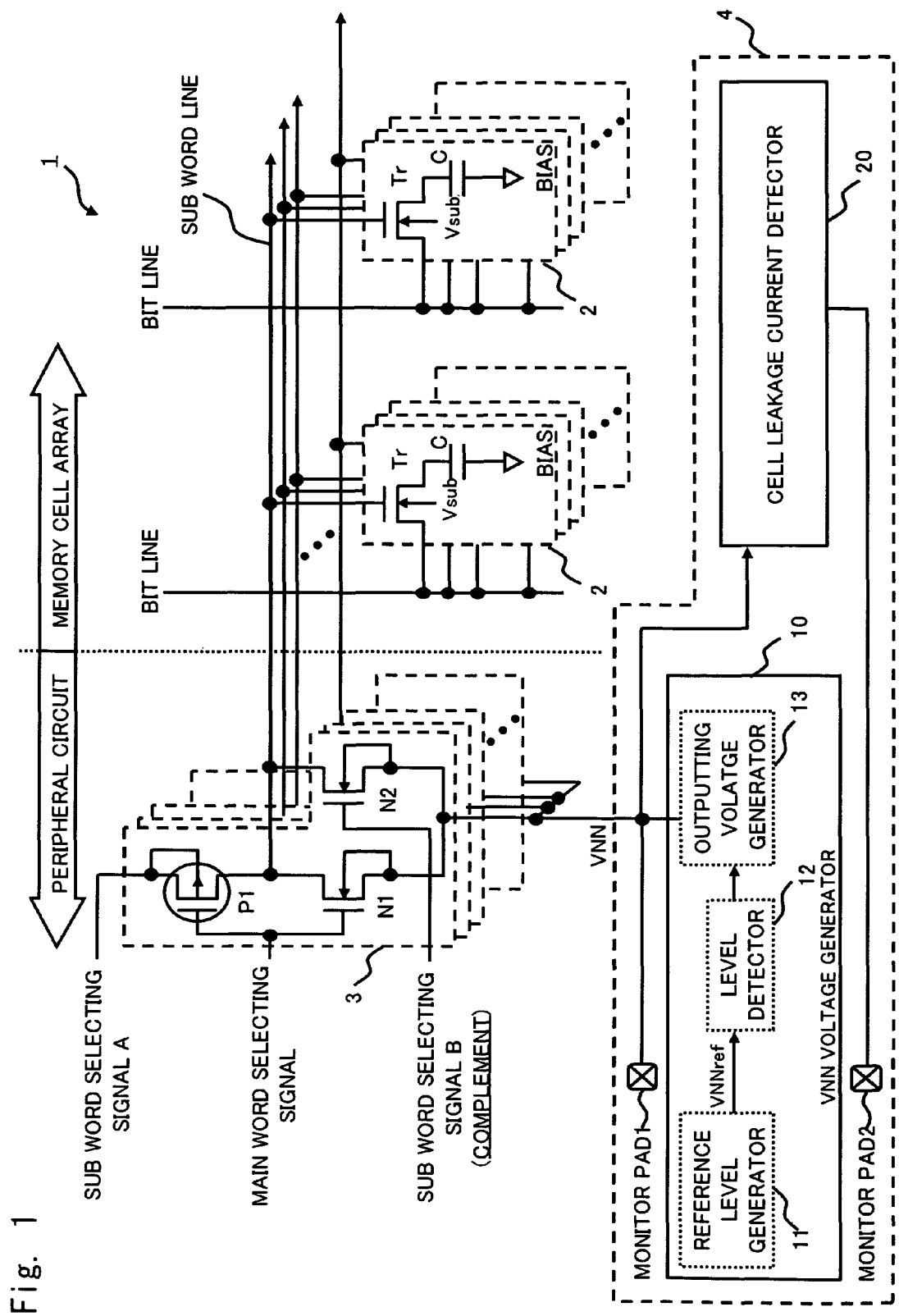
FIG. 1 is a circuit diagram of a DRAM according to a first embodiment of the present invention.

FIG. 1 shows a DRAM 1 according to a first embodiment of the invention. As shown in FIG. 1, the DRAM 1 includes a plurality of memory cells 2, bit lines and sub word lines in a memory cell array, and sub word line voltage selecting circuits 3 and a voltage control circuit 4 as peripheral circuits. The DRAM 1 of the first embodiment supplies a first control voltage (e.g. control voltage VNN) which is generated by a single voltage control circuit 4 to a plurality of sub word line voltage selecting circuits 3. The sub word line voltage selecting circuits 3 are respectively connected with corresponding sub word lines, so that a sub word voltage is supplied to a plurality of memory cells 2 which are connected to the respective sub word lines.

The plurality of memory cells 2 are arranged in lattice pattern. The memory cells 2 which are placed in the same column are connected to one bit line, and the memory cells 2 which are placed in the same row are connected to one word line (e.g. sub word line). One of the plurality of bit lines is activated by a column decoder (not shown) to thereby designate a row to perform reading/writing. The sub word lines are controlled by a main word signal which is output from a row decoder (not shown) to thereby designate a column to perform reading/writing.

The sub word line voltage selecting circuit 3 includes a PMISFET P1 (note that, in the following description, if a MISFET is denoted by a specific reference symbol, FET is represented as "transistor", i.e. "PMIS transistor P1", for clear understanding), and NMIS transistors N1 and N2. The PMIS transistor P1 and the NMIS transistor N1 are inverters, and their drains are connected to each other and gates are supplied with a main word selecting signal. The source of the PMIS transistor P1 is supplied with a sub word selecting signal A, and the source of the NMIS transistor N1 is connected to a control voltage VNN. Specifically, the sub word line voltage selecting circuit 3 controls, by the main word selecting signal, the voltage of the sub word lines to the voltage which has the same signal level as the sub word selecting signal A or to the voltage which is the same as the control voltage VNN. The control voltage VNN is generated by the voltage control circuit 4 to deactivate the transfer transistor Tr of the memory cell 2. The control voltage VNN and the voltage control circuit 4 are described in detail later. The sub word selecting signal A supplies a boot voltage which is higher than a power supply voltage, for example, to activate the transfer transistor Tr of the memory cell 2.

The gate of the NMIS transistor N2 in the sub word line voltage selecting circuit 3 is supplied with a sub word selecting signal B, the source is connected to the control voltage VNN, and the drain is connected to a sub word line. Specifically, the NMIS transistor N2 controls the sub word selecting signal B to operate in the same logic as the main word selecting signal to thereby contribute to setting the voltage of the sub word line to the control voltage VNN when the above inverters output the control voltage VNN.

The voltage control circuit 4 generates the control voltage VNN for deactivating the MISFET and supplies the generated control voltage to the plurality of sub word line voltage selecting circuits 3. The voltage control circuit 4 includes a voltage generator (e.g. VNN voltage generator) 10 and a cell leakage current detector 20. The VNN voltage generator 10 includes a reference level generator 11, a level detector 12, and an outputting voltage generator 13. The reference level generator 11 generates a reference level voltage VNNref for the control voltage VNN whose voltage level is controlled by the level detector 12 and the outputting voltage generator 13. The level detector 12 outputs a control signal for controlling the voltage value of the control voltage VNN in accordance with a change in the gate voltage at which the leakage current of the MISFET is substantially minimal with respect to the device temperature. The outputting voltage generator 13 generates the control voltage in accordance with the control signal. The cell leakage current detector 20 reproduces the leakage current which is generated in the memory cell 2 formed in the memory cell array. It then outputs a leakage current detecting voltage VA in accordance with the current value of the reproduced leakage current. The voltage control circuit 4 is described in detail later.

The memory cell 2 includes a transfer transistor Tr and a capacitor C. The transfer transistor Tr has the gate connected to the sub word line, a first terminal connected to the bit line, and a second terminal connected to one terminal of the capacitor C. The other terminal of the capacitor C is connected to a BIAS having a prescribed voltage.

Figure 2:
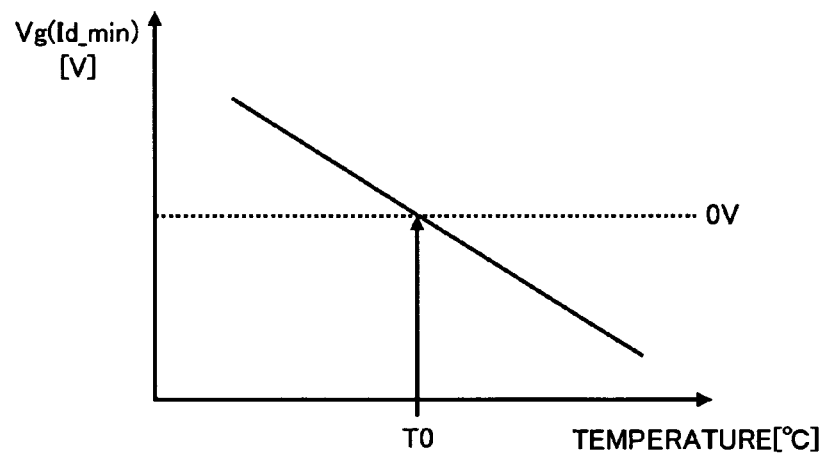
FIG. 2 is a graph showing the relationship between a gate voltage and a device temperature at which leakage current is minimal according to the first embodiment.
Figure 19:
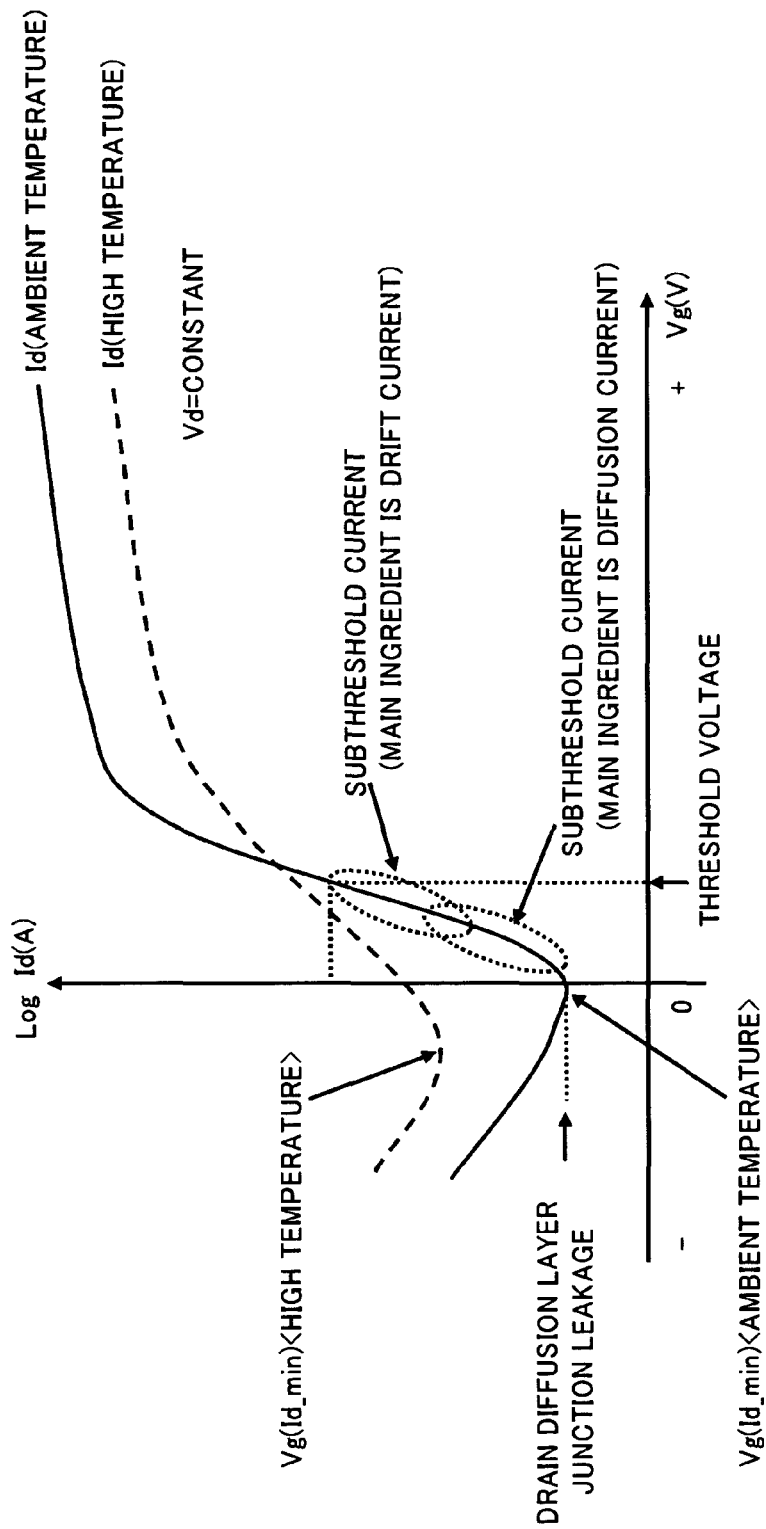
FIG. 19 is a graph showing the relationship between a gate voltage and drain current of a MISFET.

The characteristics of the transfer transistor Tr is described hereinafter. The transfer transistor Tr may be a MISFET, for example, and have the gate voltage-drain current characteristic shown in FIG. 19. Specifically, the leakage current is minimal at Vg=0V under an ambient temperature. Under a high temperature, the leakage current can be minimized by setting the gate voltage Vg to a negative voltage. The transfer transistor Tr is in the active or inactive state in accordance with the voltage of the sub word line. The transfer transistor Tr is activated when the sub word selecting signal A is applied, and it is deactivated when the control voltage VNN is applied. In order to prolong the time to hold charges in the capacitor C in the DRAM 1, it is necessary to reduce the leakage current when the transfer transistor Tr is inactive. The leakage current involves the subthreshold leakage current flowing between the source region and the drain region, the drain diffusion layer junction leakage current flowing from the drain region to the substrate region, and the band to band tunnel leakage current (GIDL) as described earlier. The combination of these leakage current has the characteristics that the leakage current is minimal at a prescribed gate voltage Vg(Id_min). The gate voltage Vg(Id_min) varies with a device temperature. FIG. 2 shows the relationship between the gate voltage Vg(Id_min) and the device temperature.

The characteristics of the change in the gate voltage Vg(Id_min) with respect to the device temperature shown in FIG. 2 are obtained as a result of experiments by the inventors. The inventors have found that the gate voltage Vg(Id_min) changes linearly with respect to the device temperature when the temperature T of the semiconductor integrated circuit device is in the range of 0° C. to 100° C. The gate voltage Vg(Id_min) can be approximated by the following Expression 1:

$$Vg(Id\_min)<T> \propto -\alpha * T$$

where $Vg(Id\_min)<T>$ represents $Vg(Id\_min)$ under a device temperature T (in Celsius or Kelvin), and $\alpha$ is $\alpha>0$ which is a constant (in V/° C. or V/K) determined by a process or device structure. In the NMISFET which is produced by way of trial by the inventors, the value of $\alpha$ is approximately 0.01 where T is in units of ° C.

The characteristics shown in FIG. 2 can be approximated by the following Expression 2:

$$Vg(Id\_min)<T> = -\alpha * T + \beta$$

where $\beta$ is a constant (in units of V) with which $Vg(Id\_min)=$ 0V at T=T0. T0 may not be an ambient temperature.

Specifically, the leakage current can be minimized regardless of the device temperature by setting the control voltage VNN to substantially the same as the gate voltage Vg(Id_min) and by substantially equalizing the change in the control voltage VNN and the change in the gate voltage Vg(Id_min) respectively with respect to the device temperature. In this embodiment, the control voltage VNN is generated by the voltage control circuit 4, and therefore the voltage control circuit 4 can change the control voltage VNN. The voltage control circuit 4 is described in detail hereinbelow.

Figure 3:
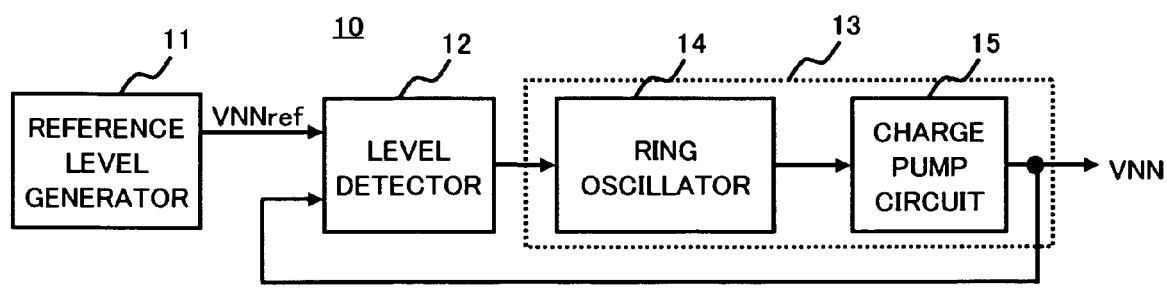
FIG. 3 is a block diagram showing a voltage control circuit according to the first embodiment.

FIG. 3 is a block diagram of the voltage control circuit 4. The voltage control circuit 4 includes the reference level generator 11, the level detector 12, and the outputting voltage generator 13. The reference level generator 11 sets the voltage level of the reference level voltage VNNref. The reference level voltage VNNref is input to the level detector 12 and compared with the control voltage VNN. The reference level voltage VNNref is not temperature dependent. The level detector 12 detects the level of the control voltage VNN based on a difference between the reference level voltage VNNref and the control voltage VNN generated by the voltage control circuit 4. Based on the detection result, the level detector 12 outputs a control signal. The outputting voltage generator 13 includes a ring oscillator 14 and a charge pump circuit 15. The ring oscillator 14 generates a clock signal having a prescribed frequency in accordance with the control signal output from the level detector 12. The charge pump circuit 15 controls the voltage level of the control voltage VNN in accordance with the frequency of the clock signal generated by the ring oscillator 14.

Figure 4:
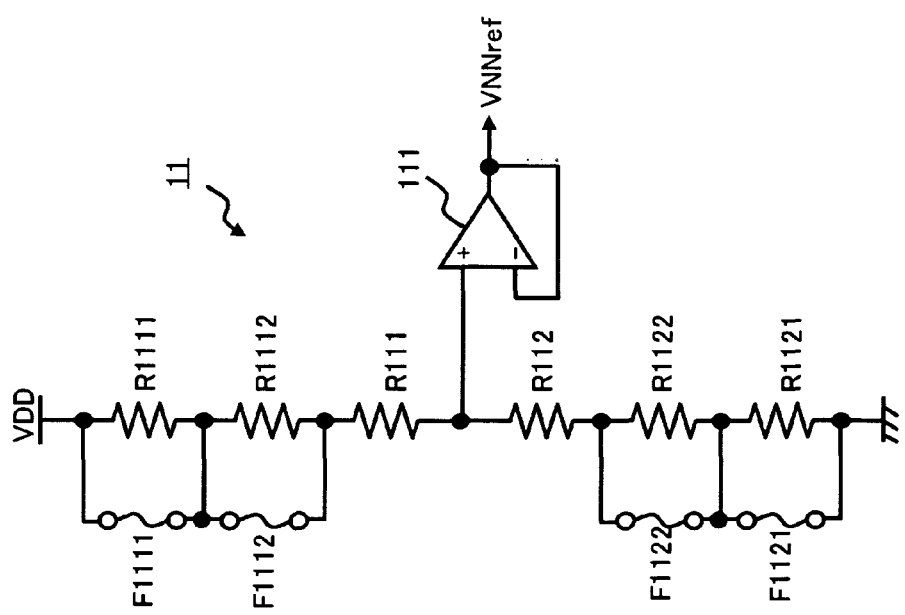
FIG. 4 is a circuit diagram showing an example of a reference level generator according to the first embodiment.

Each block of the voltage control circuit 4 is described in further detail hereinafter. FIG. 4 is the block diagram showing one example of the reference level generator 11. As shown in FIG. 4, the reference level generator 11 includes a plurality of resistors (e.g. resistors R111, R112, R1111, R1112, R1121, R1122), a plurality of line changing elements which serve as level setting elements (e.g. fuses F1111, F1112, F1121, F1122), and a buffer 111.

The plurality of resistors are connected in series between the power supply voltage VDD and the ground voltage VSS. In this embodiment, the resistors are connected in the sequence of: R1111, R1112, R111, R112, R1121 and R1122 from the power supply voltage VDD to the ground voltage VSS. The fuse F1111 is connected in parallel with the resistor R1111, the fuse F1112 is connected in parallel with the resistor R1112, the fuse F1121 is connected in parallel with the resistor R1121, and the fuse F1122 is connected in parallel with the resistor R1122. The buffer 111 is an amplifier in which the output terminal and the inverting input terminal are connected to each other. The noninverting input terminal of the amplifier is connected to the node between the resistors R111 and the R112. The buffer circuit 111 outputs the voltage which is set by the plurality of resistors as the reference level voltage VNNref through its output terminal.

The fuse operates as a line when it is connected. When the fuse is cutout, the both ends of the fuse are electrically isolated from each other. The fuse may be cutout after manufacturing the semiconductor device by using a tool such as a laser cutter. If the fuse is cutout, the resistor which is connected in parallel with the relevant fuse becomes valid. Although this embodiment uses a fuse as an example, other elements which can change the connection after manufacture, such as a short-circuit fuse (e.g. zener zap) and a switching element, may be used instead.

As another example of the reference level generator 11, it is possible to use a memory such as a ROM (Read Only Memory) for retaining the setting of a reference voltage. In such a case, it is necessary to determine which setting in the ROM to use by an external control signal. The reference level generator 11 is not limited to the one shown in FIG. 4 as long as it can change the value of a generated reference voltage after manufacturing the semiconductor device.

Figure 5:
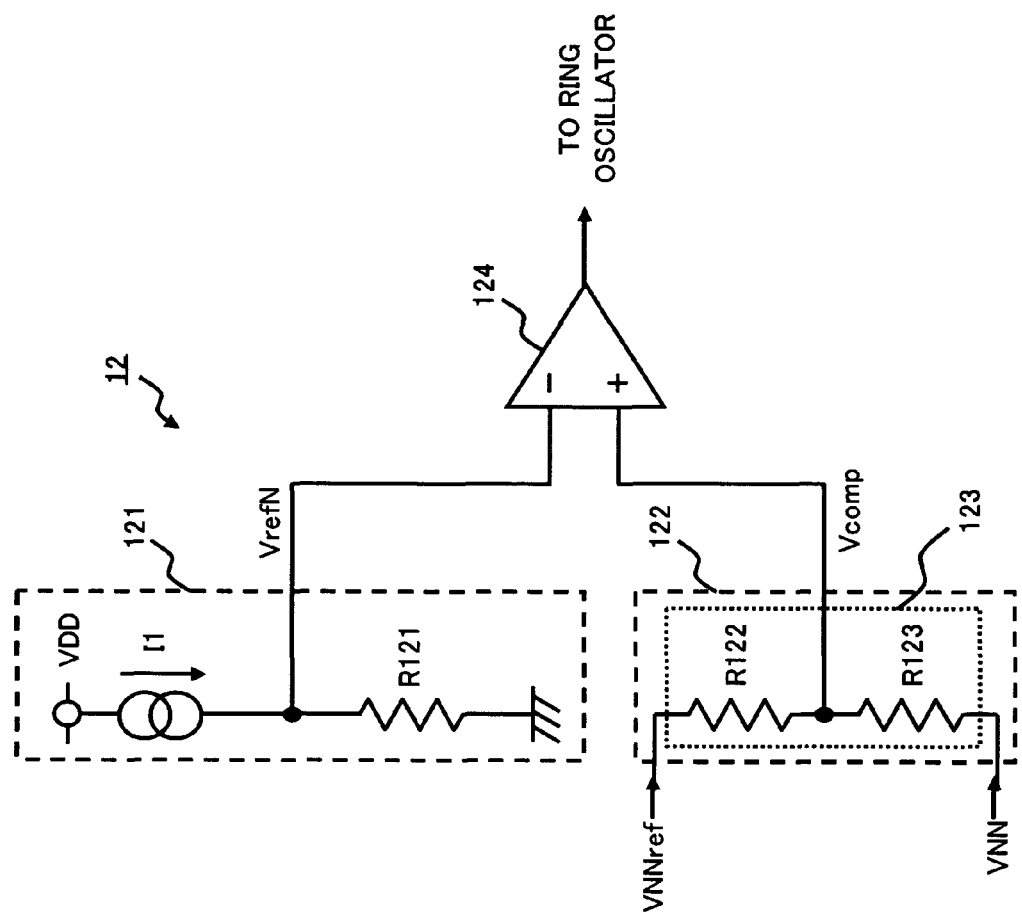
FIG. 5 is a circuit diagram showing a level detector according to the first embodiment.

The level detector 12 is described in detail hereinafter. FIG. 5 shows a circuit diagram of the level detector 12. The level detector 12 includes a reference voltage generator 121, a comparing voltage generator 122, and a comparator 124. The reference voltage generator 121 includes a constant current source I1 and a first resistor (e.g. a resistor R121). The constant current source I1 and the resistor R121 are connected in series between the power supply voltage VDD and the ground voltage GND, and a reference voltage VrefN is output from the node between the constant current source I1 and the resistor R121. The current value I1 of the constant current source I1 does not vary by the temperature, for example. The resistor R121 may be formed of polysilicon, for example, and has the negative temperature characteristics that a resistance value decreases at a certain rate as the device temperature becomes higher. Thus, the reference voltage generator 121 generates a voltage of: I1*R1=VrefN. The reference voltage VrefN has the temperature characteristics which corresponds to the temperature characteristics of the resistor R121.

In the comparing voltage generator 122, a voltage dividing element 123 is connected between the terminal to input the reference level voltage VNNref and the terminal to input the control voltage VNN. In the voltage dividing element 123, a resistor R122 and a resistor R123 are connected in series, for example, and a comparing voltage Vcomp is output from the node between the resistor R122 and the resistor R123. The resistors R122 and R123 may be formed of polysilicon and have the negative temperature characteristics that the resistance values decrease at the same rate with respect to the device temperature as the device temperature becomes higher. Thus, the comparing voltage generator 122 generates a voltage of: VNN+(R123/(R122+R123))*(VNNref−VNN)= Vcomp. Because the resistors R122 and R123 change at the same rate with respect to the device temperature, the comparing voltage Vcomp does not vary with the device temperature. The comparing voltage Vcomp is the value that divides the reference level voltage VNNref and the control voltage VNN by the resistance division ratio of the resistor R122 and the resistor R123.

The comparator 124 compares the reference level voltage VNNref with the comparing voltage Vcomp. If the reference level voltage VNNref is larger than the comparing voltage Vcomp, the comparator 124 outputs High level (e.g. power supply voltage). If the reference level voltage VNNref is smaller than the comparing voltage Vcomp, the comparator 124 outputs Low level (e.g. ground voltage).

Figure 6:
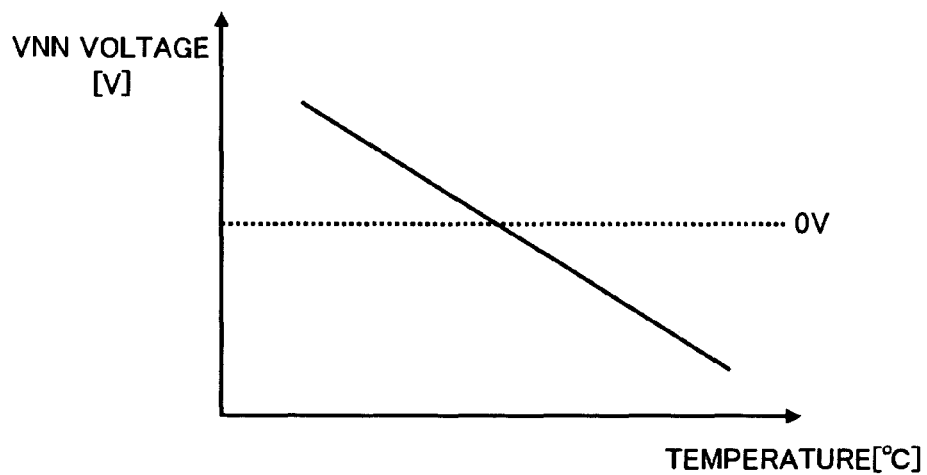
FIG. 6 is a graph showing the relationship between a control voltage VNN and a device temperature according to the first embodiment.

The voltage control circuit 4 thus generates the control voltage VNN which changes depending on the temperature characteristics of the reference level voltage VNNref of the level detector 12. The control voltage VNN has the value which is set by the reference level voltage VNNref and the resistors R121 to R123. FIG. 6 shows an example of a change in the control voltage VNN with respect to the device temperature. In this embodiment, the change in the control voltage VNN with respect to the device temperature is set to be substantially the same as the change in the gate voltage Vg(Id_min) with respect to the device temperature as shown in FIG. 6.

If a DRAM includes a plurality of memory cell array, the voltage control circuit 4 may be disposed for each memory cell array. Alternatively, the voltage control circuit 4 may be disposed for each word line which is connected with each memory cell.

Figure 7:
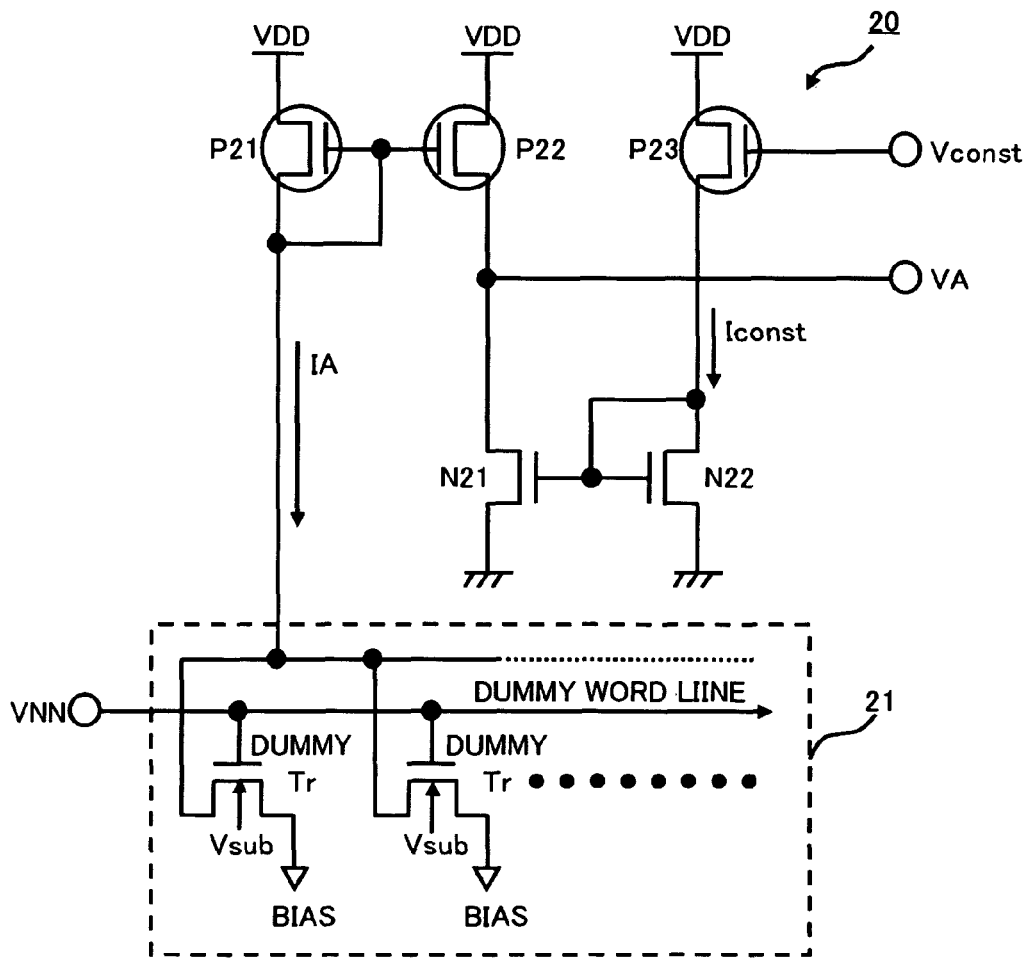
FIG. 7 is a circuit diagram showing a cell leakage current detector according to the first embodiment.

The cell leakage current detector 20 is described hereinafter in detail. FIG. 7 shows the block diagram of the cell leakage current detector 20. As shown in FIG. 7, the cell leakage current detector 20 includes a dummy cell 21, PMIS transistors P21 to P23, and NMIS transistors N21 and N22. The dummy cell 21 may have the same number of leakage detecting field effect transistors (e.g. dummy transistors) as the number of transfer transistors Tr which are connected to one sub word line in the memory cell array, for example. The sources of the dummy transistors are connected respectively to the BIAS voltage (e.g. half voltage of the power supply voltage VDD), and the drains are connected in common. The gates of the dummy transistors are connected to a dummy word line. The dummy word line is supplied with the control voltage VNN generated by the VNN voltage generator 10. The cell leakage current detector 20 is preferably disposed in the vicinity of the memory cell array or within the memory cell array. The shape and size of each dummy transistor is preferably substantially the same as the shape and size of the transfer transistor Tr of the memory cell 2. This enables the accurate reproduction of the leakage current which is generated in the memory cell 2 in the memory cell array.

The source terminals of the PMIS transistors P21 and P22 are connected to the power supply voltage VDD. The gate terminals of the PMIS transistors P21 and P22 are connected to each other. The gate terminal and the drain terminal of the PMIS transistors P21 are connected to each other. The drain terminal of the PMIS transistors P21 is connected to a common junction point at which the drain terminals of the dummy transistors in the dummy cell 21 are connected in common. The drain terminal of the PMIS transistors P22 is connected to the terminal to output a leakage current detecting voltage VA.

The source terminal of the PMIS transistors P23 is connected to the power supply voltage VDD. The gate terminal of the PMIS transistors P23 is supplied with a voltage Vconst at which the current output from the drain terminal of the PMIS transistors P23 is substantially constant regardless of the temperature. The drain terminal of the PMIS transistors P23 is connected to the drain terminal of the NMIS transistor N22. The source terminals of the NMIS transistors N21 and N22 are connected to the ground voltage VSS. The gate terminals of the NMIS transistors N21 and N22 are connected to each other. The gate terminal and the drain terminal of the NMIS transistor N22 are connected to each other. The drain terminal of the NMIS transistor N21 is connected to the terminal to output a leakage current detecting voltage VA.

The cell leakage current detector 20 reproduces the leakage current which is generated in the memory cell 2 formed on the memory cell array in accordance with the voltage level of the control voltage VNN and outputs the voltage (e.g. the leakage current detecting voltage VA) in accordance with the current value of the leakage current. Specifically, the cell leakage current detector 20 supplies the control voltage VNN which is supplied to the non-selected memory cell 2 to the gate of the dummy transistor of the dummy cell 21, thereby reproducing the leakage current which is generated in the memory cell 2 using the dummy cell 21. The reproduced current is output as leakage current IA through a current mirror of the PMIS transistors P21 and P22. Further, the PMIS transistor P23 outputs a constant current Iconst regardless of the temperature. The current Iconst is output through a current mirror of the NMIS transistors N21 and N22. Thus, the cell leakage current detector 20 outputs through its output terminal the voltage which is based on the ratio of the leakage current IA and the current Iconst as the leakage current detecting voltage VA.

Figure 8:
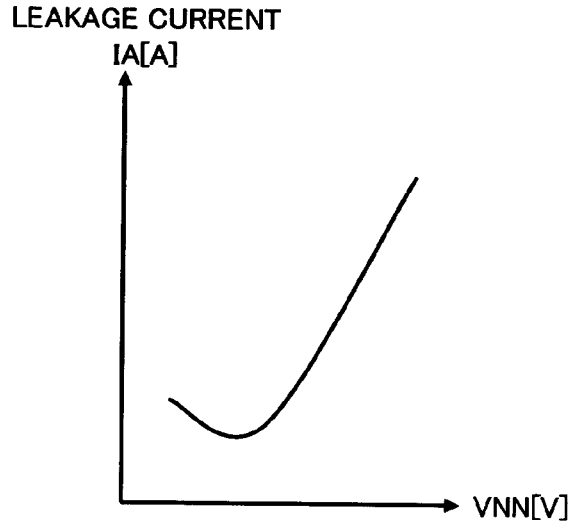
FIG. 8 is a graph showing the relationship between leakage current IA and a control voltage VNN according to the first embodiment.

FIG. 8 shows the relationship between the control voltage VNN and the leakage current IA. As shown in FIG. 8, the leakage current IA decreases as the control voltage VNN increases and reaches its minimum when the control voltage VNN is at a prescribed level. Then, when the control voltage VNN exceeds the prescribed level at which the leakage current IA is minimal, the leakage current IA increases accordingly.

Figure 9:
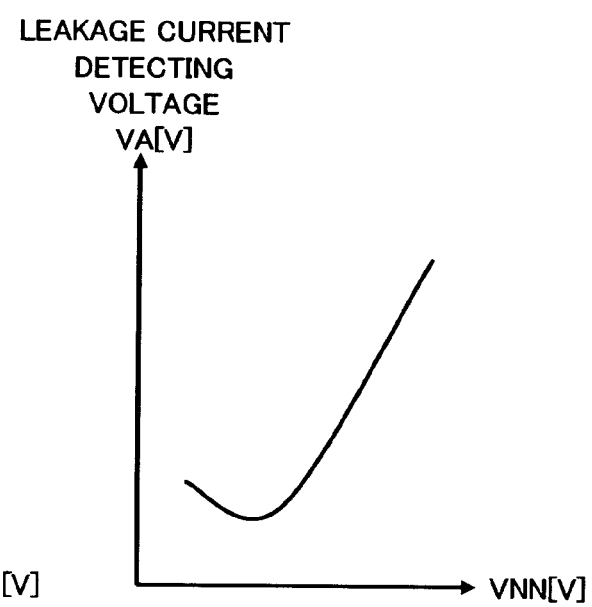
FIG. 9 is a graph showing the relationship between a leakage current detecting voltage VA and a control voltage VNN according to the first embodiment.

FIG. 9 shows the relationship between the control voltage VNN and the leakage current detecting voltage VA. As shown in FIG. 9, the leakage current detecting voltage VA decreases as the control voltage VNN increases and reaches its minimum when the control voltage VNN is at a prescribed level. Then, when the control voltage VNN exceeds the prescribed level at which the leakage current detecting voltage VA is minimal, the leakage current detecting voltage VA increases accordingly.

In this embodiment, the cell leakage current detector 20 detects the control voltage VNN at which the leakage current is minimal, and the VNN voltage generator 10 generates the control voltage VNN at which the leakage current is substantially minimal. The VNN voltage generator 10 can change the value of the control voltage VNN in accordance with the temperature if an initial value of the control voltage VNN is such a value at which the leakage current is substantially minimal. The way to set the initial value of the control voltage VNN is described hereinafter.

To set the initial value of the control voltage VNN, a prescribed voltage is applied from a monitor PAD1 which is connected to the output of the VNN voltage generator 10 while the VNN voltage generator 10 stops. Then, the leakage current detecting voltage VA is monitored using a monitor PAD2 which is connected to the output of the cell leakage current detector 20, so that the value of the control voltage VNN at which the leakage current detecting voltage VA is substantially minimal is detected. Further, the setting of the fuse or ROM of the reference level generator 11 is changed appropriately so as to adjust the reference level voltage VNNref to the detected voltage value. The initial value of the control voltage VNN is thereby set to the value at which the leakage current of the memory cell 2 is substantially minimal.

As described above, in the DRAM 1 of the first embodiment, the voltage control circuit 4 generates the control voltage VNN to be applied to the gate when the MISFET is inactive. The control voltage VNN is set to substantially the same as the gate voltage Vg(Id_min) at which the leakage current is minimized. Further, the change in the control voltage VNN with respect to the device temperature is set to substantially the same as the change in the gate voltage Vg(Id_min) with respect to the device temperature. Consequently, the DRAM 1 of the first embodiment can maintain a minimum leakage current for each device temperature even if the device temperature varies. Accordingly, the DRAM 1 of the first embodiment can minimize the power consumption during standby under any temperature.

Because the values of α and β vary by the process or device structure, an LSI designer can obtain these values by measuring them in advance. If the substrate voltage is altered, the voltage Vg(Id_min) changes. In such a case, the LSI designer can allow the control voltage VNN to have the characteristics corresponding to the voltage Vg(Id_min) of the relevant device by measuring the temperature dependence of the voltage Vg(Id_min) in advance. However, altering the substrate voltage largely affects the drain diffusion layer junction leakage component of the subthreshold current. Accordingly, the change in the gate voltage with respect to the temperature described in the first embodiment cannot be simply applied to the substrate voltage. There is an optimum combination for each of the substrate voltage/gate voltage controlled under an ambient temperature, the substrate voltage/gate voltage controlled under a high temperature, and the substrate voltage/gate voltage controlled under a low temperature. Further, the control of the substrate voltage is implemented by the circuit which operates in the same manner as the voltage control circuit 4, for example. The control of the substrate voltage is described in detail later.

In the DRAM 1 of the first embodiment, the control voltage VNN can be a negative voltage. Even if the control voltage VNN is a negative voltage, a time to switch the voltage of the sub word line from the control voltage VNN to the sub word selecting signal A is not extended unless the gate voltage of the MISFET is set excessively low. Therefore, this embodiment enables the reduction of the leakage current without sacrificing the access speed to the memory cell 2.

The setting range of the control voltage VNN is preferably lower than the withstand voltage of the gate insulating layer.

If, for example, the control voltage VNN and the gate voltage of the NMISFET exceed the withstand voltage of the gate insulating layer, this can break down the element. Further, the deterioration of the element over time becomes serious if a voltage difference between the drain and source of a MISFET is larger than a rated voltage. A period during which the effect of the deterioration over time is small and no defect occurs in the element is called a TDDB (Time dependent Dielectric Breakdown) life. The control voltage VNN is preferably set to fall in the range which does not shorten the TDDB life.

This embodiment detects the characteristics of the change in the leakage current with respect to the device temperature and sets the change in the control voltage VNN with respect to the device temperature to substantially the same as the characteristics of the change in the leakage current with respect to the device temperature. Alternatively, it is possible to form a reference MISFET on a semiconductor substrate and set the voltage value of the control voltage VNN and the change in the control voltage VNN with the device temperature in accordance with the characteristics of the reference MISFET.

Second Embodiment

The voltage control circuit 4 according to the first embodiment measures the value of the control voltage VNN at which the leakage current is minimal by the cell leakage current detector 20 and sets the initial value of the control voltage VNN based on the measurement result. On the other hand, a voltage control circuit 4a according to a second embodiment of the invention measures the leakage current during the operation of the DRAM and reflects the measurement result to the value of the control voltage VNN. Thus, the voltage control circuit 4a of the second embodiment implements the automatic control of the value of the control voltage VNN.

Figure 10:
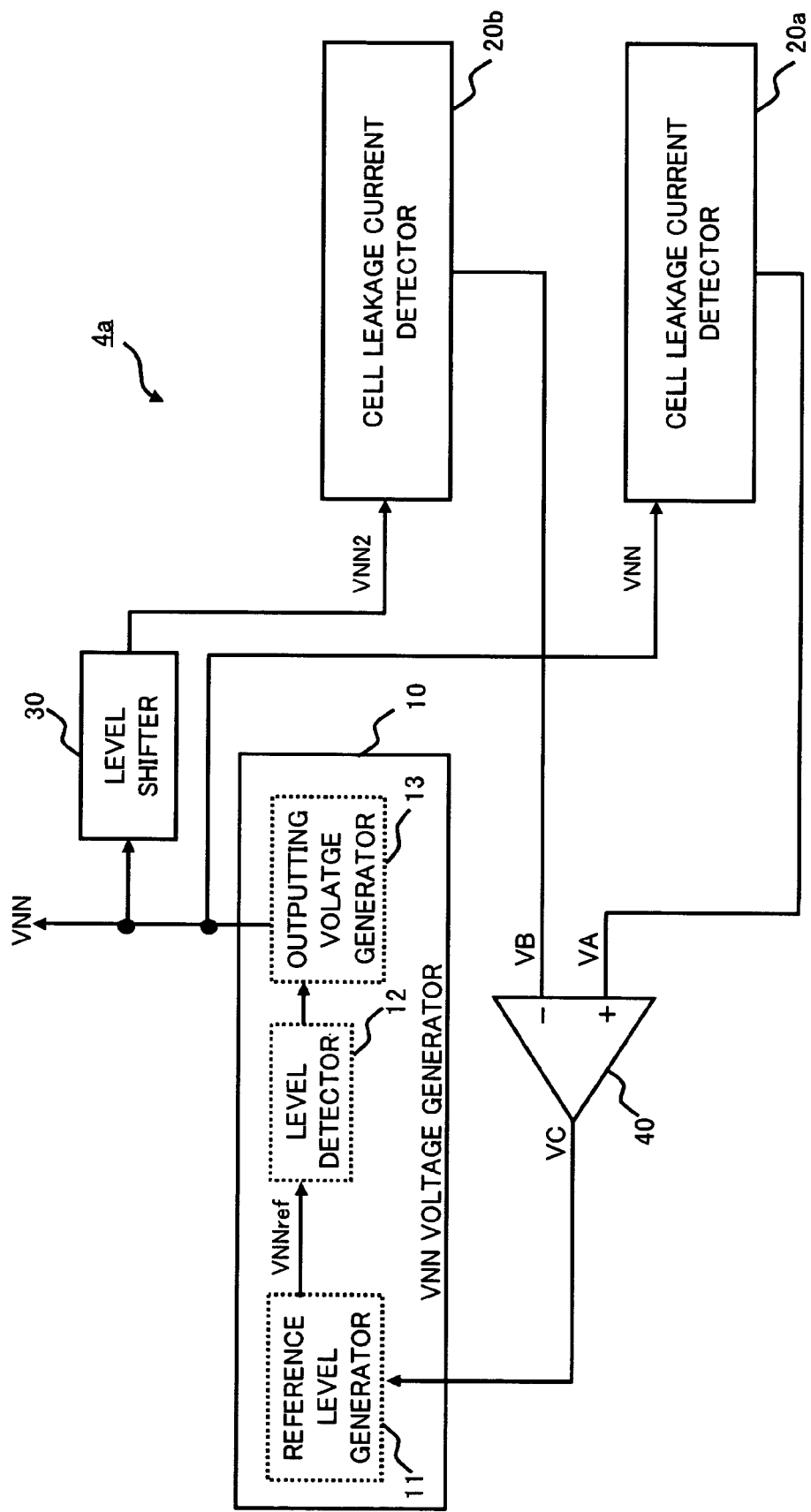
FIG. 10 is a block diagram showing a voltage control circuit according to a second embodiment of the present invention.

The voltage control circuit 4a is described in detail hereinafter. FIG. 10 is a block diagram showing the voltage control circuit 4a. As shown in FIG. 10, the voltage control circuit 4a includes a second cell leakage current detector (e.g. cell leakage current detector 20b), a level shifter 30, and a comparator 40 in addition to the elements of the voltage control circuit 4 according to the first embodiment. A first cell leakage current detector (e.g. cell leakage current detector 20a) corresponds to the cell leakage current detector 20 of the first embodiment, but it is denoted by a different reference symbol for discrimination from the cell leakage current detector 20b. The cell leakage current detectors 20a and 20b are substantially the same circuit as the cell leakage current detector 20 of the first embodiment.

The level shifter 30 outputs a voltage VNN2 which is shifted from the control voltage VNN by several tens to several hundreds of mV. In this embodiment, the voltage VNN2 is lower than the control voltage VNN by several tens of mV. The comparator 40 receives the output of the cell leakage current detector 20a at the noninverting terminal and the output of the cell leakage current detector 20b at the inverting terminal. Based on a difference between the voltages input to the noninverting terminal and the inverting terminal, the comparator 40 sets the output voltage VC to High level or Low level. The reference level generator 11 of the second embodiment inverts the level of the output voltage VC supplied from the comparator 40. Thus, the reference level generator 11 of the second embodiment may be an inverter or the like.

In the voltage control circuit 4a of the second embodiment, the VNN voltage generator 10 operates based on a difference between the leakage current detecting voltage VA which is output in accordance with the control voltage VNN and a leakage current detecting voltage VB which is output in accordance with the voltage VNN2 that is shifted from the control voltage VNN. The operation is described hereinbelow.

Figure 11:
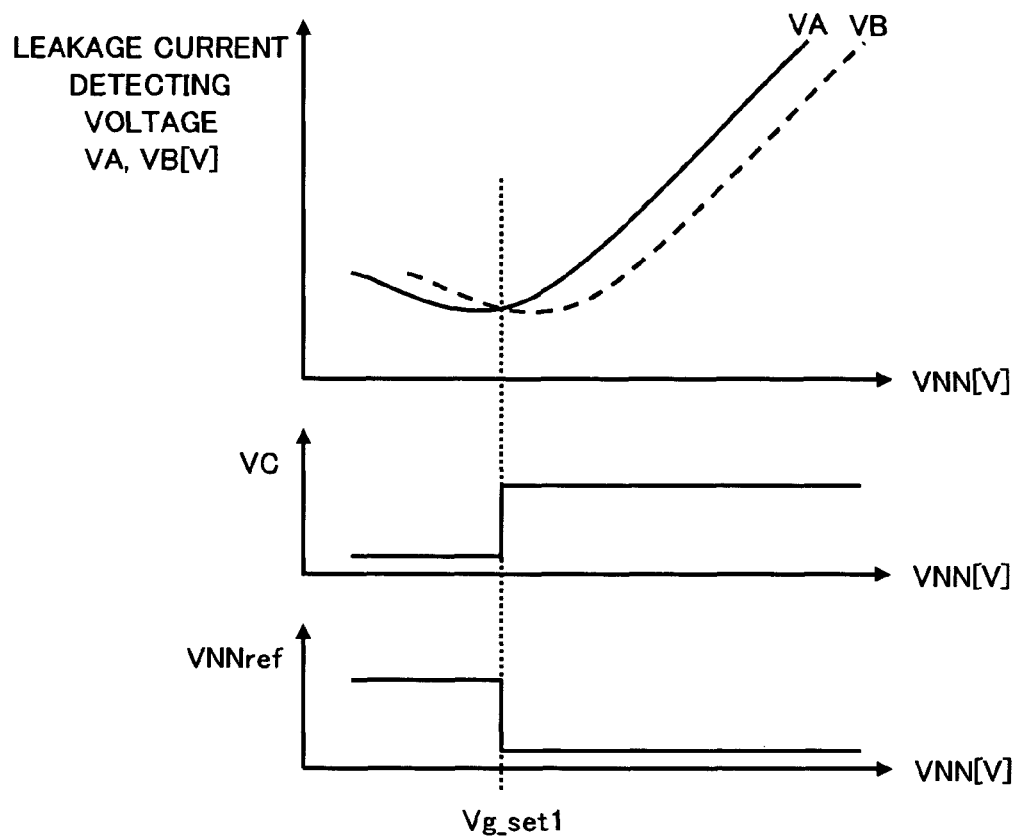
FIG. 11 is a graph showing the relationship between each voltage generated in the voltage control circuit and a control voltage VNN according to the second embodiment.

FIG. 11 shows the relationship of the voltages which are generated in the voltage control circuit 4a. The upper graph in FIG. 11 shows the relationship between the control voltage VNN and the leakage current detecting voltages VA and VB. In this graph, the curve of the leakage current detecting voltage VB is a shifted version of the curve of the leakage current detecting voltage VA. Thus, the minimum value of the leakage current detecting voltage VB is the value that shifts the minimum value of the leakage current detecting voltage VA. The curve of the leakage current detecting voltage VA and the curve of the leakage current detecting voltage VB have an intersection. The control voltage VNN which corresponds to the intersection (i.e. the voltage Vg_set1 in FIG. 11) serves as an output change point of the comparator 40. The intersection is preferably close to the value of the control voltage VNN at which the leakage current detecting voltage VA is substantially minimal.

The middle graph in FIG. 11 shows the relationship between the control voltage VNN and the output voltage VC of the comparator 40. The output voltage VC is High level when the control voltage VNN is higher than the voltage Vg_set1 and it is Low level when the control voltage VNN is lower than the voltage Vg_set1.

The lower graph in FIG. 11 shows the relationship between the control voltage VNN and the reference level voltage VNNref of the reference level generator 11. The reference level voltage VNNref is an inverted version of the output voltage VC. The VNN voltage generator 10 operates to increase the control voltage VNN when the reference level voltage VNNref is High level. On the other hand, the VNN voltage generator 10 operates to decrease the control voltage VNN when the reference level voltage VNNref is Low level.

Thus, the voltage control circuit 4a of the second embodiment automatically changes the control voltage VNN so that it approximates the voltage Vg_set1. The voltage Vg_set1 is set to the range at which the leakage current detecting voltage VA is substantially minimal. Accordingly, the voltage control circuit 4a of the second embodiment can maintain the leakage current generated in the memory cell 2 to be substantially minimal without performing the initial setting as in the first embodiment.

Third Embodiment

A level detector 12a according to a third embodiment of the present invention is such that the comparing voltage generator 122 of the first embodiment is replaced with a comparing voltage generator 122a of the third embodiment. The comparing voltage generator 122 of the first embodiment determines the values of the resistors R122 and R123 at the time of design. On the other hand, the comparing voltage generator 122a of the third embodiment can adjust the values of the resistors R122 and R123 before shipment by laser trimming, for example, in addition to determining the values of the resistors R122 and R123 in design. The same blocks as in the first embodiment are denoted by the same reference symbols and not particularly described herein.

Figure 12:
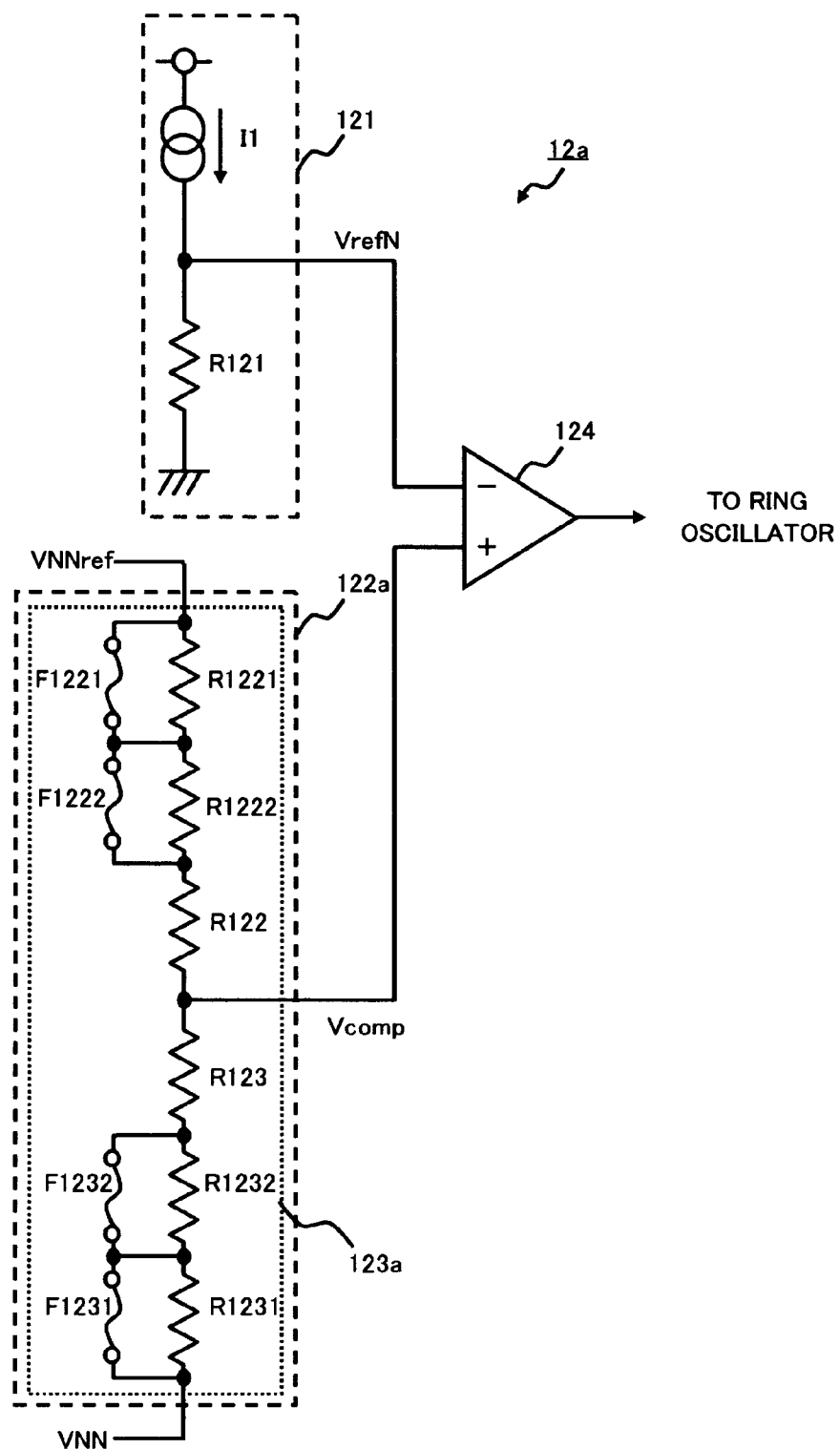
FIG. 12 is a circuit diagram showing a level detector according to a third embodiment of the present invention.

FIG. 12 is a circuit diagram of the level detector 12a according to the third embodiment. As shown in FIG. 12, in the level detector 12a of the third embodiment, a voltage dividing element 123a is connected between the terminal to input the reference level voltage VNNref and the terminal to input the control voltage VNN. In the voltage dividing element 123a, resistors R122, R1221, R1222, R123, R1231 and R1232 are connected in series, and a comparing voltage Vcomp is output from the node between the resistor R122 and the resistor R123. Further, fuses F1221, F1222, F1231 and F1232 are connected in parallel with the resistors R1221, R1222, R1231 and R1232, respectively.

In this configuration, the comparing voltage generator 122a of the third embodiment can measure the control voltage VNN after manufacturing the semiconductor integrated circuit device, e.g. in the shipping inspection process, and adjust it if the measured value is different from an expected value. The adjustment may cutout any of the fuses connected on the reference level voltage VNNref side if the measured control voltage VNN is lower than the expected value.

A case of cutting the fuse F1221 to adjust the control voltage VNN is described hereinafter by way of illustration. It is assumed that the control voltage VNN is lower than the reference level voltage VNNref. The comparing voltage Vcomp before cutting the fuse F1221 is represented as VNN+(R123/(R122+R123))*(VNNref−VNN). On the other hand, the comparing voltage Vcomp after cutting the fuse F1221 is represented as VNN+(R123/(R122+R1221+R123))*(VNNref−VNN). Thus, the comparing voltage Vcomp shifts to a lower value when the fuse is cutout. The voltage control circuit 4 of the third embodiment thereby operates to increase the control voltage VNN.

The resistance value may be changed not only by a breaking means such as a fuse but also by an energizing means such as a zener zap to set the resistor to be valid or invalid by energization.

As described in the foregoing, the DRAM 1 of the third embodiment can generate a control voltage VNN more accurately than the DRAM 1 of the first embodiment. Further, the accurate generation of the control voltage VNN enables the further reduction of the leakage current compared with the first embodiment.

Fourth Embodiment

Figure 13:
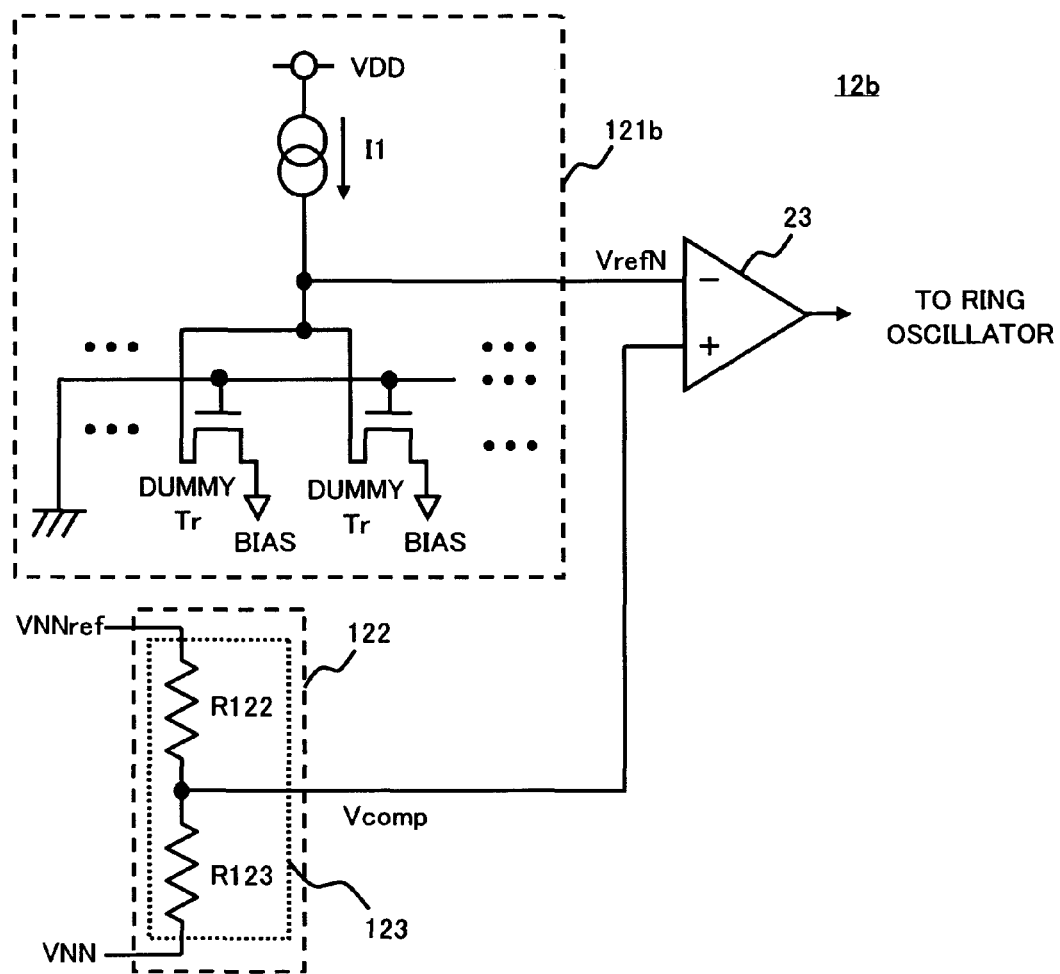
FIG. 13 is a circuit diagram showing a level detector according to a fourth embodiment of the present invention.

In the level detector 12 of the first embodiment, the reference voltage VrefN is generated by the resistor R121 and the constant current source I1. On the other hand, in a level detector 12b of a fourth embodiment of the invention, the reference voltage VrefN is generated by a field effect transistor (e.g. MISFET) of a prescribed shape and the constant current source I1. The MISFET of a prescribed shape has substantially the same shape as a field effect transistor which forms a memory cell, for example. Thus, the level detector 12b of the fourth embodiment is such that the resistor R121 of the first embodiment is replaced with a MISFET of a prescribed shape. FIG. 13 is a circuit diagram showing the level detector 12b according to the fourth embodiment. The elements other than the level detector 12b are substantially the same as in the first embodiment and not particularly described herein.

As shown in FIG. 13, the level detector 12b of the fourth embodiment includes the reference voltage generator 121b. The reference voltage generator 121b includes the constant current source I1 and a plurality of dummy transistors. The constant current source I1 is substantially the same as that in the first embodiment. The plurality of MISFETs each have the gate terminal connected to the ground voltage GND, a first terminal (e.g. drain terminal) connected to the constant current source I1, and a second terminal (e.g. source terminal) connected to a BIAS having a prescribed voltage. Each dummy transistor is a field effect transistor having substantially the same shape as the transfer transistor Tr which is used in the memory cell 2.

The dummy transistors connected in this manner are inactive, and leakage current flows therethrough. By converting the leakage current into resistance, the dummy transistors can be regarded equivalently as a resistor element. Thus, the dummy transistor can be considered as an equivalent resistor of the transfer transistor Tr in the inactive state. The resistance where a plurality of dummy transistors are connected to the constant current source I1 may be considered as the combined resistance where the equivalent resistors of the dummy transistors connected to the constant current source I1 are connected in parallel.

Further, if the number of dummy transistors connected to the constant current source I1 is the same as the number of memory cells connected to one sub word line, the memory cells connected to one sub word line and the dummy transistors connected to the constant current source I1 may be treated as substantially the same equivalent resistors. In such a case, if the layout of the transfer transistors Tr of the memory cells 2 which are connected to one sub word line and the layout of the dummy transistors are substantially the same, the relative accuracy increases to further equalize the equivalent resistance, which is preferred.

The level detector 12b outputs a control signal to the ring oscillator 14 by comparing the reference voltage VrefN which is generated by the dummy transistor and the constant current source I1 and the comparing voltage Vcomp which is generated by resistance division of the control voltage VNN and the reference level voltage VNNref. If the device temperature becomes higher, the sub word voltage of the memory cell at which the leakage current is substantially minimal becomes larger to the negative voltage side. In this embodiment, the reference voltage VrefN is generated based on the equivalent resistance of the dummy transistor in the inactive state which has substantially the same shape as the transfer transistor Tr of the memory cell 2. Thus, if the equivalent resistance of the inactive transfer transistor Tr decreases due to an increase in the device temperature, the equivalent resistance of the inactive dummy transistor decreases accordingly, and the generated voltage VrefN also decreases accordingly. As a result, the control voltage VNN generated by the voltage control circuit 4 becomes lower.

As described in the foregoing, the level detector 12b of the fourth embodiment realizes the equivalent resistance of the inactive memory cell 2 connected to the sub word line voltage selecting circuit 3 by the equivalent resistance of the inactive dummy transistor, and generates the reference voltage VrefN using the equivalent resistance of the inactive dummy transistor. The level detector 12b outputs a control signal for controlling the value of the control voltage VNN based on the reference voltage VrefN. This enables the control of the control voltage VNN which is generated by the voltage control circuit 4 so as to substantially minimize the leakage current of the memory cell 2 connected to the sub word line voltage selecting circuit 3.

The level detector 12b of the fourth embodiment uses the MISFET of substantially the same shape in the memory cell 2 connected to the sub word line voltage selecting circuit 3 and the dummy transistor, thereby enabling the change with temperature in the equivalent resistance of the inactive dummy transistor to accurately follow the change with temperature in the equivalent resistance of the inactive memory cell 2. Consequently, the reference voltage VrefN which is generated by the dummy transistor and the constant current source I1 can accurately follow the change with temperature in the equivalent resistance of the inactive memory cell 2. Further, the control voltage VNN which is generated based on the reference voltage VrefN can accurately follow the change with temperature in the gate voltage at which the leakage current of the transfer transistor Tr is substantially minimal. As a result, the DRAM of the fourth embodiment can minimize the leakage current at higher accuracy compared with the DRAM of the first to third embodiments.

Although the resistor R121 of the level detector 12 of the first embodiment is replaced with the dummy transistor in the fourth embodiment, the resistor R122 or R123 of the level detector 12 of the first embodiment may be replaced with the dummy cell.

Fifth Embodiment

Figure 14:
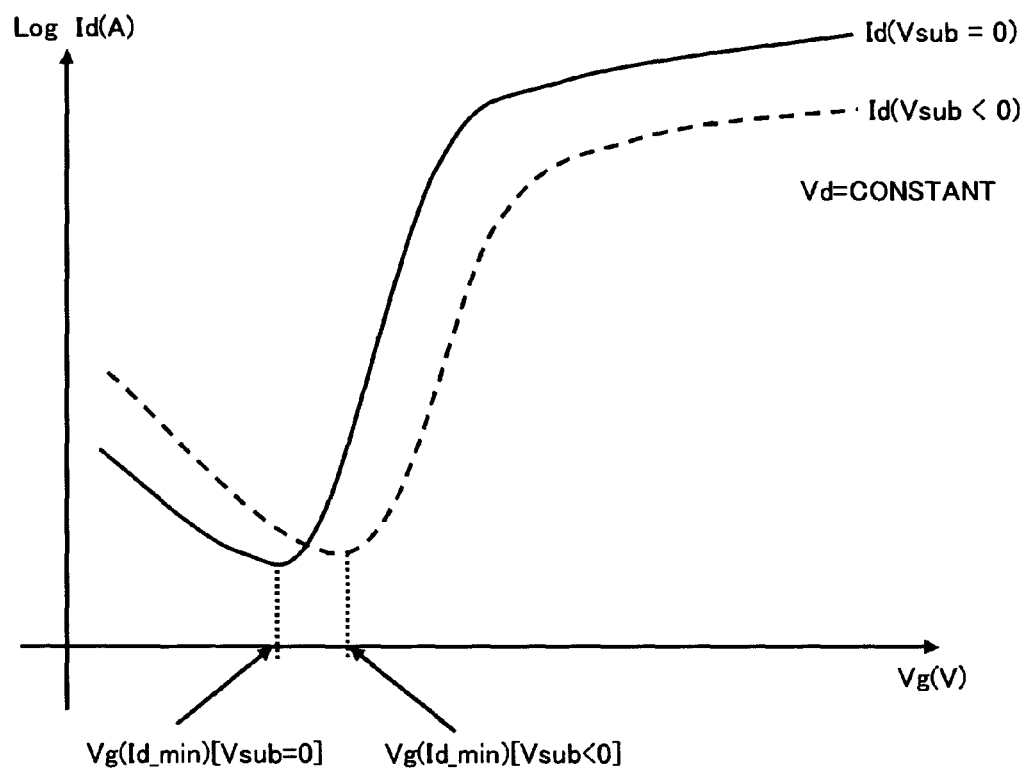
FIG. 14 is a graph showing the relationship between a substrate voltage Vsub and drain current in a transfer transistor.
Figure 15:
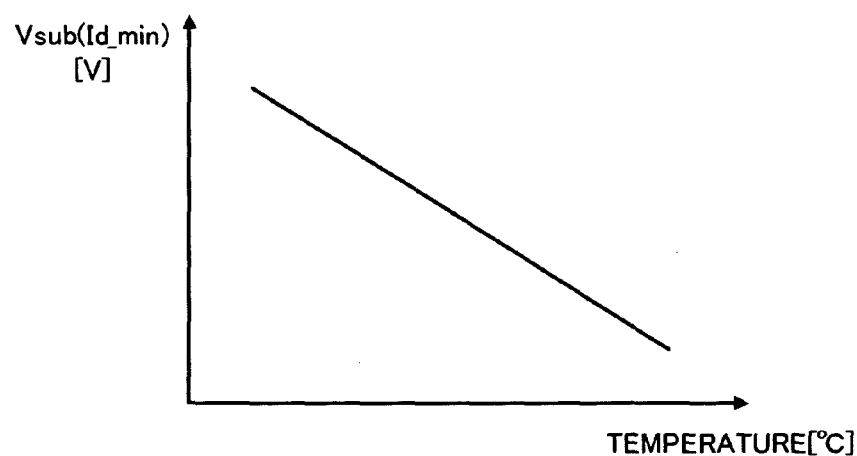
FIG. 15 is a graph showing the relationship between a substrate voltage Vsub and a device temperature at which leakage current is minimal according to a fifth embodiment of the present invention.

The DRAM according to a fifth embodiment of the present invention controls a second control voltage (e.g. substrate voltage Vsub) of the transfer transistor Tr of the memory cell 2 in addition to a first control voltage (e.g. control voltage VNN). The substrate voltage Vsub is supplied to the back gate terminal of the transistor. FIG. 14 shows the relationship between the substrate voltage Vsub and the drain current in the transfer transistor Tr. As shown in FIG. 14, the gate voltage Vg(Id_min) at which the drain current is minimal shifts to a higher value when the substrate voltage Vsub becomes negative (Vsub<0) with respect to the drain current when the substrate voltage Vsub=0V. FIG. 15 shows the relationship between the temperature change and the substrate voltage Vsub(Id_min) at which the leakage current is minimal. As shown in FIG. 15, the substrate voltage Vsub(Id_min) decreases as the temperature becomes higher.

Accordingly, in order to minimize the leakage current, the substrate voltage Vsub may be reduced in accordance with the temperature by setting the gate voltage of the transfer transistor Tr to constant. In the above embodiments, the control voltage VNN is reduced in accordance with the temperature. However, the reduction of the control voltage VNN enlarges a difference between the High level voltage of the sub word line and the control voltage VNN, which hinders the high-speed operation. The present embodiment controls both of the substrate voltage Vsub and the control voltage VNN, thereby achieving the high-speed operation and the reduction of the leakage current at the same time.

Figure 16:
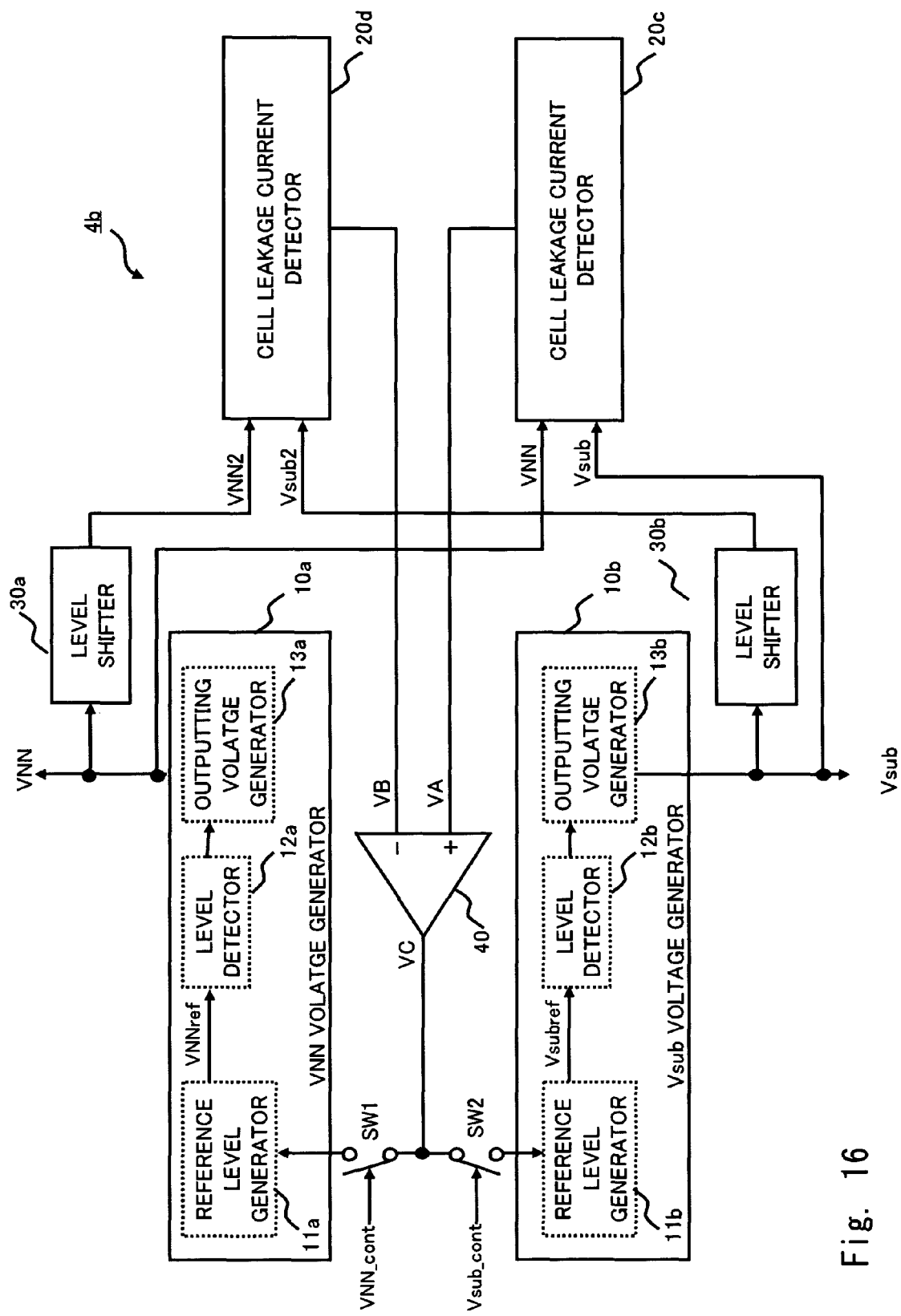
FIG. 16 is a block diagram showing a voltage control circuit according to the fifth embodiment.

FIG. 16 is a block diagram of the voltage control circuit 4b according to the fifth embodiment. As shown in FIG. 16, the voltage control circuit 4b includes a first voltage generator (e.g. VNN voltage generator) 10a, a second voltage generator (e.g. Vsub voltage generator) 10b, first and second cell leakage current detectors (e.g. cell leakage current detectors 20c and 20d), level shifters 30a and 30b, a comparator 40, and switches SW1 and SW2. The VNN voltage generator 10a, the Vsub voltage generator 10b, and the cell leakage current detectors 20c and 20d are substantially the same circuits as the VNN voltage generator 10 and the cell leakage current detector 20, respectively, of the first embodiment. The level shifters 30a, 30b, and the comparator 40 are substantially the same circuits as the level shifter 30 and the comparator 40, respectively, of the second embodiment. The reference symbols of these blocks are different for convenience in description.

The substrate voltage Vsub which is output from the Vsub voltage generator 10b of this embodiment is supplied to the memory cell array as a substrate voltage of the transfer transistor Tr of the memory cell array. The substrate voltage Vsub is also supplied to the dummy cell 21 as a substrate voltage Vsub of the dummy transistor of the cell leakage current detectors 20c and 20d. The cell leakage current detector 20c receives the substrate voltage Vsub which is generated by the Vsub voltage generator 10b. On the other hand, the cell leakage current detector 20d receives a substrate voltage Vsub2 that is shifted from the substrate voltage Vsub which is generated by the Vsub voltage generator 10b.

The switch SW1 is connected between the reference level generator 11a and the output of the comparator 40. The switch SW2 is connected between the reference level generator 11b and the output of the comparator 40. The on/off of the switches SW1 and SW2 is controlled by a control signal VNN_cont and a control signal Vsub_cont, respectively.

Figure 17:
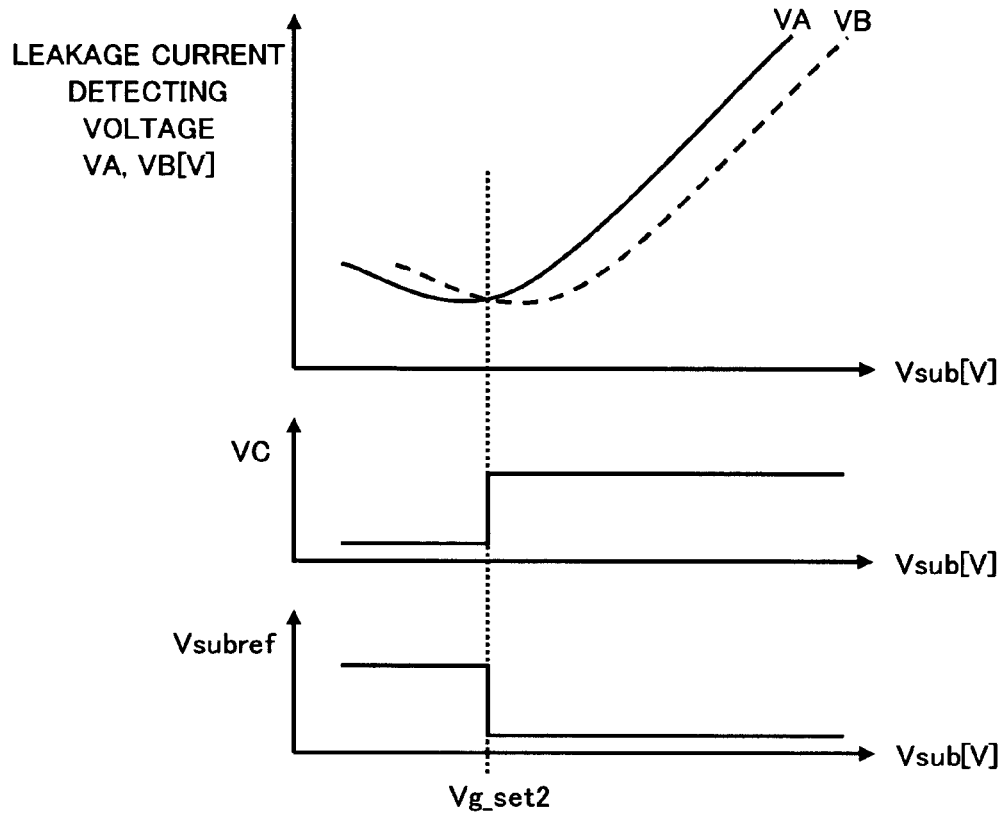
FIG. 17 is a graph showing the relationship between each voltage generated in the voltage control circuit and a substrate voltage Vsub according to the fifth embodiment.

The relationship between the substrate voltage Vsub and each voltage is described hereinafter. The relationship between the control voltage VNN and the leakage current detecting voltages VA and VB is the same as described in the second embodiment and thus not described herein. FIG. 17 shows the relationship between each voltage generated in the voltage control circuit 4b and the substrate voltage Vsub. The upper graph in FIG. 17 shows the relationship between the substrate voltage Vsub and the leakage current detecting voltages VA and VB. In this graph, the curve of the leakage current detecting voltage VB is a shifted version of the curve of the leakage current detecting voltage VA. Thus, the minimum value of the leakage current detecting voltage VB is the value that shifts the minimum value of the leakage current detecting voltage VA. The curve of the leakage current detecting voltage VA and the curve of the leakage current detecting voltage VB have an intersection. The substrate voltage Vsub which corresponds to the intersection (i.e. the voltage Vg_set2 in FIG. 17) serves as an output change point of the comparator 40. The intersection is preferably close to the value of the substrate voltage Vsub at which the leakage current detecting voltage VA is substantially minimal.

The middle graph in FIG. 17 shows the relationship between the substrate voltage Vsub and the output voltage VC of the comparator 40. The output voltage VC is High level when the substrate voltage Vsub is higher than the voltage Vg_set2 and it is Low level when the substrate voltage Vsub is lower than the voltage Vg_set2.

The lower graph in FIG. 17 shows the relationship between the substrate voltage Vsub and the reference level voltage Vsubref of the reference level generator 11b. The reference level voltage Vsubref is an inverted version of the output voltage VC. The VNN voltage generator 10b operates to increase the substrate voltage Vsub when the reference level voltage Vsubref is High level. On the other hand, the VNN voltage generator 10b operates to decrease the substrate voltage Vsub when the reference level voltage Vsubref is Low level.

Thus, the voltage control circuit 4b of the fifth embodiment automatically changes the substrate voltage Vsub so that it approximates the voltage Vg_set2. The voltage Vg_set2 is set to the range at which the leakage current detecting voltage VA is substantially minimal. Accordingly, the voltage control circuit 4b of the fifth embodiment can maintain the leakage current generated in the memory cell 2 to be substantially minimal without performing the initial setting as in the first embodiment.

Further, the voltage control circuit 4b controls the substrate voltage Vsub in addition to the control voltage VNN, thereby suppressing the change in the control voltage VNN. By setting the substrate voltage Vsub to negative, the gate voltage Vg(Id_min) at which the leakage current is minimal shifts to a higher level. Then, by setting the control voltage VNN to the shifted gate voltage Vg(Id_min), the change in the control voltage VNN can be suppressed. This reduces a difference between the High level voltage of the sub word line and the control voltage VNN, thereby enabling the high-speed operation of the DRAM.

In the fifth embodiment, the control voltage VNN and the substrate voltage Vsub are kept to prescribed constant values when the device temperature is under a prescribed temperature (e.g. ambient temperature). When the device temperature exceeds the prescribed temperature, the control voltage VNN and the substrate voltage Vsub are controlled. This is because, though an increase in the leakage current is significant to cause a problem under a high device temperature, the amount of the leakage current does not pose any significant problem under a low device temperature. Not performing the control when the device temperature is low enables the reduction of the current consumption in the circuit.

Figure 18:
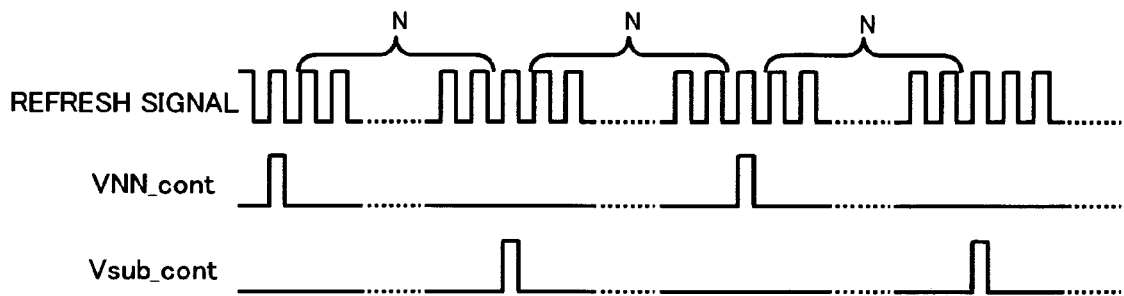
FIG. 18 is a timing chart of a control signal for causing the voltage control circuit to operate according to the fifth embodiment.

Further, the voltage control circuit 4b of the fifth embodiment adjusts the voltage to be generated once every prescribed number of times of refresh operation. FIG. 18 shows the timing chart of this operation. As shown in FIG. 18, in the voltage control circuit 4b, the pulse of the control signal VNN_cont and the pulse of the control signal Vsub_cont are input alternately once in every prescribed number of times (e.g. N times in FIG. 18) of refresh operation (one pulse of the refresh signal corresponds to one refresh operation). The switch SW1 turns on in response to the pulse of the control signal VNN_cont, and the switch SW2 turns on in response to the pulse of the control signal Vsub_cont. Thus, the voltage control circuit 4b steps up or down the voltage every prescribed number of times of refresh operation. The adjustment of the control voltage VNN and the adjustment of the substrate voltage Vsub are thereby performed alternately.

This eliminates the need that the voltage control circuit 4b operates constantly, thereby reducing the power consumption. Further, the alternate implementation of voltage adjustment enables effective coordinate operation of the control voltage VNN and the substrate voltage Vsub.

The substrate voltage Vsub is preferably set to the range in which the forward voltage of a parasitic diode of the MISFET does not flow with respect to the substrate voltage or well voltage. If the substrate voltage is the ground voltage, for example, the control voltage VNN is preferably −0.7V or higher.

The present invention is not limited to the above embodiments but may be altered in various ways. Although the gate voltage of the field effect transistor is continuously variable in accordance with the temperature in the above embodiments, it is possible to preset the gate voltage to keep a fixed value such as X[V] under an ambient temperature, (X−A)[V] under a high temperature (e.g. 50° C. or higher), and (X+A) [V] under a low temperature (e.g. 0° C. or lower). Then, if the circuit having the same function as the voltage control circuit 4 enables X[V] under an ambient temperature to change to (X−α)[V] or (X+β)[V] in accordance with the manufacturing condition of the device using a trimming fuse or the like and further changes the voltage under an ambient temperature relatively with respect to the temperature, the optimum current characteristics of the device in accordance with temperature conditions can be obtained. Further, the present invention is not limited to a memory such as a DRAM or a SRAM, and may be applied to any other circuits using a field effect transistor such as a logic circuit.

Although the above embodiments describe the case where the transfer transistor Tr is formed of an NMIS transistor, the transfer transistor Tr may be formed of a PMIS transistor. In such a case, the control voltage VNN and the substrate voltage Vsub step up and down in the opposite manner from the above embodiments. Specifically, the present invention controls the control voltage VNN and the substrate voltage Vsub so as to reduce the leakage current on the basis of the voltage when the control voltage VNN and the substrate voltage Vsub are not controlled. The control enlarges the absolute value of a difference from the reference voltage. It is preferred that the control voltage VNN and the substrate voltage Vsub can be controlled independent of each other.

It is apparent that the present invention is not limited to the above embodiment that may be modified and changed without departing from the scope and spirit of the invention.

What is claimed is:

1. A semiconductor integrated circuit device comprising:
a field effect transistor; and
a voltage control circuit generating a control voltage to be supplied to a gate terminal of the field effect transistor for deactivating the field effect transistor, the voltage control circuit controlling a voltage so as to substantially minimize leakage current flowing when the field effect transistor is inactive in accordance with a device temperature,
wherein the voltage control circuit includes:
a cell leakage current detector reproducing leakage current generated in the field effect transistor of an inactive state based on the control voltage and generating a detecting voltage in accordance with a current value of the leakage current; and
a voltage generator setting a voltage value of the control voltage based on the detecting voltage and changing the voltage value of the control voltage in accordance with a device temperature,
wherein the cell leakage current detector includes a leakage current detecting field effect transistor having substantially the same shape or electrical characteristics as the field effect transistor and generates the detecting voltage in accordance with a current value of leakage current generated in the leakage current detecting field effect transistor.

2. The semiconductor integrated circuit device according to claim 1, wherein the voltage control circuit controls a voltage so as to change linearly with respect to a device temperature.

3. The semiconductor integrated circuit device according to claim 1, wherein the voltage control circuit controls a voltage based on a relationship of:

$$Vg(T) \propto -*T$$

where Vg(T) is the control voltage with respect to a prescribed device temperature, T is a device temperature, and α is a constant determined by a process or device structure.

4. The semiconductor integrated circuit device according to claim 1, wherein the voltage control circuit generates, as the control voltage, at least one of a first control voltage to be supplied to the gate terminal of the field effect transistor and a second control voltage to be supplied to a back gate terminal of the field effect transistor.

5. The semiconductor integrated circuit device according to claim 1, wherein the leakage current detecting field effect transistor operates based on the control voltage output from the voltage generator.

6. The semiconductor integrated circuit device according to claim 1, wherein the voltage generator includes a reference level generator setting a reference level of a voltage to be generated, and the reference level generator stores setting using one level setting element selected from a cutoff fuse, a short-circuit fuse, a switching element and a logic memory circuit and generates a reference level voltage in accordance with a state of the level setting element.

7. The semiconductor integrated circuit device according to claim 6, wherein the state of the level setting element is set in accordance with the detecting voltage.

8. The semiconductor integrated circuit device according to claim 1, wherein the field effect transistor to which the control voltage is supplied is a transfer transistor of a memory cell.

9. The semiconductor integrated circuit device according to claim 8, wherein the transfer transistor becomes inactive when the control voltage is applied to the gate terminal.

10. The semiconductor integrated circuit device according to claim 1, wherein a gate voltage of the field effect transistor is a word voltage of a memory cell.

11. The semiconductor integrated circuit device according to claim 1, wherein the voltage control circuit is disposed for each of a plurality of memory cell array blocks or each word line connected to each memory cell.

12. A semiconductor integrated circuit device comprising:
a field effect transistor; and
a voltage control circuit generating a control voltage to be supplied to a gate terminal of the field effect transistor for deactivating the field effect transistor, the voltage control circuit controlling a voltage so as to substantially minimize leakage current flowing when the field effect transistor is inactive in accordance with a device temperature,
wherein the voltage control circuit includes:
a cell leakage current detector reproducing leakage current generated in the field effect transistor of an inactive state based on the control voltage and generating a detecting voltage in accordance with a current value of the leakage current; and
a voltage generator setting a voltage value of the control voltage based on the detecting voltage and changing the voltage value of the control voltage in accordance with a device temperature,
wherein the voltage control circuit includes a first cell leakage current detector outputting a first detecting voltage based on the control voltage output from the voltage generator, and a second cell leakage current detector outputting a second detecting voltage based on a voltage shifted from the control voltage.

13. The semiconductor integrated circuit device according to claim 12, wherein the control voltage input to the second cell leakage current detector is different from the control voltage output from the voltage generator by several tens to several hundreds of mV.

14. The semiconductor integrated circuit device according to claim 12, wherein the voltage generator increases or decreases the control voltage based on a difference between the first detecting voltage and the second detecting voltage.

15. The semiconductor integrated circuit device according to claim 12, wherein the voltage control circuit increases or decreases the control voltage output from the voltage generator every prescribed number of times of refresh operation.

* * * * *